(12) United States Patent
Corisis

(10) Patent No.: US 6,339,253 B1
(45) Date of Patent: Jan. 15, 2002

(54) SEMICONDUCTOR PACKAGE

(75) Inventor: David J. Corisis, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/385,203

(22) Filed: Aug. 30, 1999

(51) Int. Cl.⁷ .................... H01L 23/495; H01L 23/498
(52) U.S. Cl. ........................ 257/676; 257/689
(58) Field of Search ................... 257/670, 671, 257/675, 676, 688, 689

(56) References Cited

U.S. PATENT DOCUMENTS

| | | | | |
|---|---|---|---|---|
| 4,788,583 A | * | 11/1988 | Kawahara et al. | 257/670 |
| 4,997,517 A | * | 3/1991 | Parthasarathi | 156/630 |
| 5,376,909 A | * | 12/1994 | Nelson et al. | 333/247 |
| 5,583,377 A | * | 12/1996 | Higgins, III | 257/707 |
| 5,907,184 A | * | 5/1999 | Corisis et al. | 257/666 |
| 6,130,474 A | * | 10/2000 | Corisis | 257/676 |
| 6,222,258 B1 | * | 4/2001 | Asano et al. | 257/675 |

\* cited by examiner

Primary Examiner—Allan R. Wilson
(74) Attorney, Agent, or Firm—Dickstein Shapiro Morin & Oshinsky LLP

(57) ABSTRACT

A semiconductor package is provided which includes a semiconductor die which is formed in a die mounting area of a substrate. The die mounting area includes a frame with an opening formed therein, a die paddle, and bars which connect the die paddle to the frame. The die mounting area forms a cavity to receive the semiconductor die such that an active surface of the semiconductor die is planar with the top surface of the substrate. A strip of tape with circuitry may be applied to the active surface to minimize fractures and bumps in the tape.

19 Claims, 5 Drawing Sheets

SEMICONDUCTOR PACKAGE

BACKGROUND OF THE INVENTION

The present invention relates generally to semiconductor packaging and manufacturing, and more particularly to a package for a semiconductor die.

Recently, electronic systems have incorporated high-level semiconductor devices, such as integrated circuits, to perform complex processing functions. The integrated circuits include diodes, resistors, capacitors, transistors, and microprocessors. These devices are commonly connected together on the integrated circuit or semiconductor die. The semiconductor die is packaged in a structure which includes terminal connections which may be connected to a printed circuit board or other substrate. The resulting semiconductor die may be connected to multiple integrated circuits to perform multiple functions in the electronic system.

The demand in integrated circuit design has increased toward smaller circuits via miniaturization which can perform more functions. One technique is to increase the functions and decrease the size of the circuit. Another technique is to increase the circuit density of the semiconductor die. To achieve these demands, more input/output connections are formed from the semiconductor die to a surface of the substrate.

Generally, the semiconductor die is initially mounted to a die receiving area. The die protrudes from a surface of the substrate, and is electrically connected to the substrate by the bond wires. Known methods for forming the electrical connections include wirebonding and tape-automated bonding (TAB). In TAB, metal tape leads are attached between bond pads on the semiconductor die and bond pads on the substrate. An encapsulant may be used to cover the bond wires and metal tape leads to prevent contamination. In wirebonding, a plurality of bond wires are attached one at a time from each bond pad on the semiconductor die to a corresponding bond pad on the substrate. After the electrical connections are formed and the die is encapsulated, a trim and form operation is used to separate the die from the package into individual integrated circuits.

Several types of packaging are known. Typical packages include ball grid array (BGA), flip chip, micro-BGA, fine pitch BGA, and chip scale packages.

Currently, each of these packages requires special tooling and supplies to form the package. One drawback to the current package designs is that they do not provide adequate structural support for the non-active surface (i.e. the surface of the die which is not connected to the die receiving area) of the semiconductor die during the packaging process. This causes chip failure because the chip tends to crack or fracture. This means that the portion of the tape between adjacent dice tends to crack during the trim and form process. This is because the tape is not adequately supported between adjacent dice on the substrate. Another drawback is that the current substrates do not provide a suitable recessed surface for the TAB applications.

Therefore, a need exists for a semiconductor package that protects the die from cracking or fracturing during a semiconductor packaging process.

SUMMARY OF THE INVENTION

In general, the invention is directed to a semiconductor package which includes a substrate having a die-mounting area. The die-mounting area forms a cavity to receive a semiconductor die such that an active surface of the die is planar with the top surface of the substrate.

Accordingly, in one aspect, the semiconductor package includes a substrate having a first surface and a second surface. A frame is formed on the first surface to define an opening in the substrate, and a plurality of bars extend from the second surface of the substrate before the opening. A die paddle extends between the plurality of bars to form a cavity to receive semiconductor die such that an active surface of the semiconductor die is planar with the first surface of the substrate.

Implementations of the invention include one or more of the following. The substrate may be formed from ceramic, plastic, or metal alloy. The substrate may include a plurality of first bond pads formed on the first surface, and a plurality of conductive terminals formed on the first surface. A plurality of circuit traces may be formed on the first surface to form an electrical path between selected ones of the first bond pads and the conductive terminals. The semiconductor die may include a plurality of second bond pads formed on the active surface of the die, and the semiconductor package may include a plurality of electrical connections formed between selected ones of the first and second bond pads. The electrical connections may be formed by wirebonding. The plurality of conductive terminals may be in electrical communication with a plurality of corresponding terminals on a printed circuit board. The circuit traces may be formed from aluminum, gold, or copper. An encapsulating layer may be formed on the package to encapsulate the electrical connections. The conductive terminals may be formed from gold or copper, and the first bond pads may be formed from gold or copper. A layer of tape having circuitry may be employed to apply circuitry to the active surface of the semiconductor die. The substrate may include a plurality of second indexing holes, and the tape of material may include a plurality of first indexing holes such that the first indexing holes and the second indexing holes are aligned when the circuitry is formed on the active surface of the semiconductor die. The die paddle may include a surface operable to dissipate heat. The tape of circuitry may be formed from metal. The tape of circuitry may be co-planar with the first surface.

In another aspect, the invention is directed to an electronic circuit having a substrate which includes a first surface and a second surface. The frame is formed on the first surface to define an opening in the substrate. A plurality of bars extend from the second surface of the substrate, and a die paddle extends between the plurality of bars to form a cavity to receive at least one semiconductor die. An active surface of the semiconductor die is planar with the first surface of the substrate. A printed circuit board is positioned relative to the substrate, and a plurality of electrical connections are formed between the active surface of the semiconductor die and the printed circuit board. The package may include first and second rails formed integral with or mounted on the first surface of the substrate.

In another aspect, the invention is directed to a semiconductor package which includes a substrate having a first surface and a second surface. A plurality of diemounting areas are formed in the substrate for receiving a plurality of semiconductor dice. Each of the die-mounting areas include a frame formed on the first surface of the substrate to define an opening in the substrate, and a plurality of bars extending from the second surface of the substrate. A die paddle is formed between the plurality of bars to form a cavity to receive one of the semiconductor dice such that an active surface of the semiconductor die is planar with the first surface of the substrate.

Other advantages and features of the present invention will become apparent from the following description, including the drawings and claims.

DETAILED DESCRIPTION OF THE PREFERRED EMBODIMENTS

Figure 1:
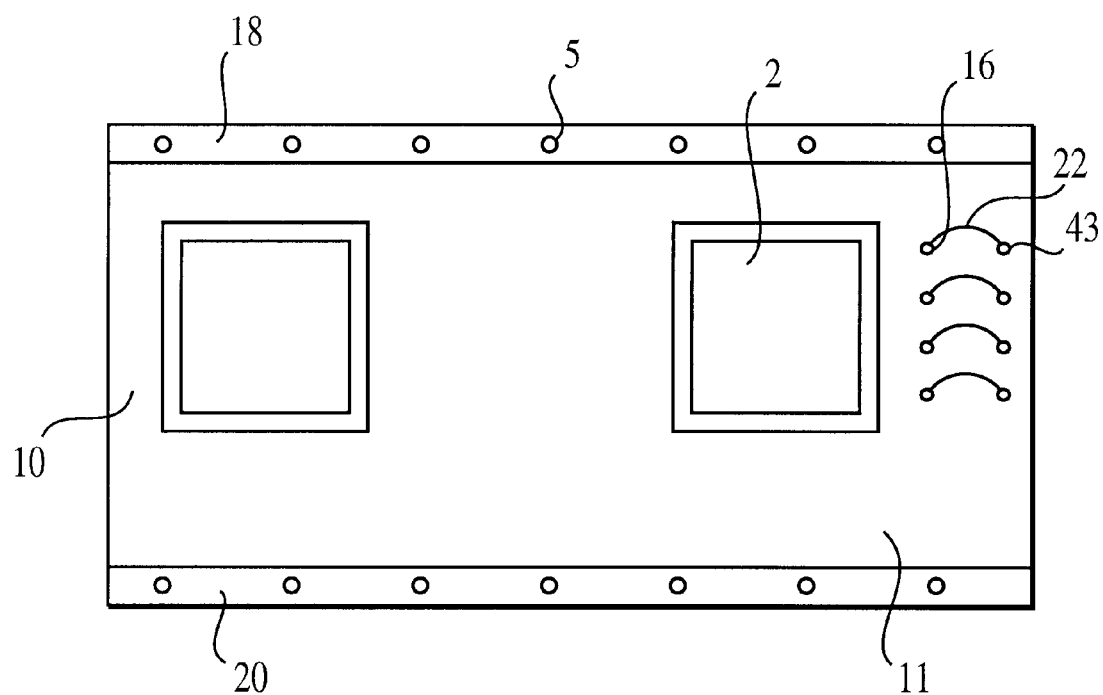
FIG. 1 illustrates a side view of a semicondtor package in accordance with a preferred embodiment.

FIG. 1 illustrates an implementation of a semiconductor package 1 in accordance with a preferred embodiment. Semiconductor package 1 includes a substrate 10. Substrate 10 is formed from a sheet of material with indexing holes 5 and side rails 18 and 20. Substrate 10 may be formed from ceramic, plastic, metal alloy, or other suitable materials. The indexing holes 5 facilitate the attachment and removal of the substrate 10 from machines during the packaging process. Side rails 18 and 20 may be formed from substrate 10. Side rails 18 and 20 may be trimmed during a trim and form operation. Side rails 18 and 20 provide support for substrate 10 and an increased stiffness for the package 1.

The substrate 10 also includes bond pads 16, conductive terminals 43, and circuit traces 22 formed onto a top surface 11 of substrate 10. The circuit traces 22 and bond pads 16 may be formed by a semiconductor metalization process, for example, sputtering.

To form bond pads 16 and circuit traces 22, a conductive insulating layer (not shown) is formed between the substrate surface 11 and the circuit traces 22. Suitable insulating layers include polyimide or KAPTON® tape. Circuit traces 22 and bond pads 16 are then etched or photopatterned into the top surface 11. Suitable materials for bond pads 16 include gold or silver. Circuit traces 22 may be formed from aluminum, copper, gold or other suitable material. Alternatively, bond pads 16 and circuit traces 22 may be mounted to top surface 11 by metal deposition. Substrate 10 also may include a finish or plating (not shown) such as palladium.

Conductive terminals 43 may be formed onto top surface 11 of substrate 10 by tape-automated bonding or wirebonding. Conductive terminals 43 provide the electrical contact of substrate 10 to a printed wiring board (not shown) or other suitable substrate. In particular, each conductive terminal 43 electrically connects a bond pad 16 of the semiconductor die to a corresponding terminal on the printed wiring board via circuit traces 22.

FIG. 1 shows a semiconductor die 2 is mounted to top surface 11 of substrate 10. A plurality of semiconductor dice 2 may also be mounted to the surface 11 of substrate 10 during packaging and manufacturing processes. The semiconductor dice 2 may be singulated into different integrated circuits using a trim and form operation. For simplicity, only one semiconductor die 2 will be discussed.

Semiconductor die 2 may be a semiconductor device, an integrated circuit, or an optical component. Semiconductor die 2 may be formed from silicon. The substrate 10 may also be formed from silicon to have a coefficient of thermal expansion (CTE) which is similar to the CTE of the semiconductor die 2. This reduces the stress developed between the substrate 10 and the semiconductor die 2 when they are exposed to heat during the packaging process.

Figure 2:
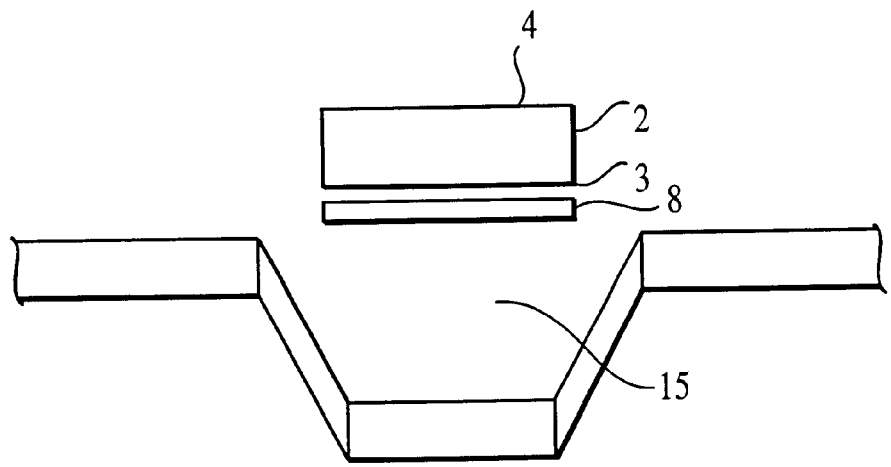
FIG. 2 is a view of a semiconductor die-mounted to the package of FIG. 1.

FIG. 2 shows that semiconductor die 2 includes a non-active surface 3. The non-active surface 3 is mounted face-down to the bottom surface of a die mounting area 15 formed in substrate 10. An adhesive layer 8 formed from, for example, epoxy, acrylic, silicon, polyimide, or other suitable dielectric material may be formed between the non-active surface 3 and the bottom surface of the die mounting area 15 to secure the semiconductor die 2 to the substrate 10.

Figure 3:
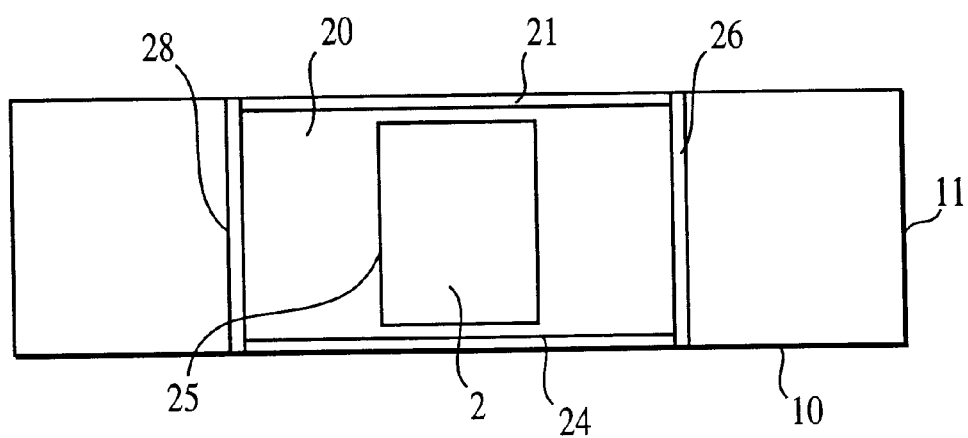
FIG. 3 is a top view of a die mounting area of the package of FIG. 1.

As shown in FIG. 3, the die mounting area 15 includes a frame 20 which forms the perimeter of the die mounting area 15. The frame 20 includes top and bottom rails 21 and 24 and side rails 26 and 28 which form an opening 25. The frame 20 may be formed in the top surface 11 of substrate 10 by etching or stamping. The frame 20 may be rectangular, square, circular, or other suitable shape which corresponds to the dimensions of semiconductor die 2. Preferably, the opening 25 of frame 20 defines an area which is slightly larger than the size of semiconductor die 2.

Figure 4:
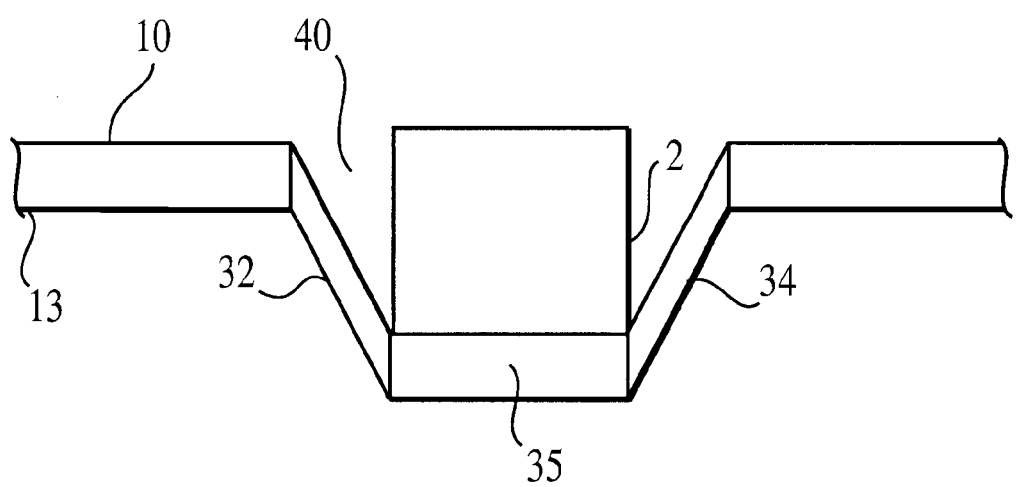
FIG. 4 illustrates a side view of the die-mounting area of FIG. 3A.

The die mounting area 15 also includes a die paddle 35 for receiving a semiconductor die 2 during the packaging process. As shown in FIG. 4, the die paddle 35 is formed below the bottom surface 13 of substrate 10. The die paddle 35 may be formed from substrate 10 by conventional down set or depression techniques. Die paddle 35 may be used as a heat sink to dissipate heat from semiconductor die 2 during processing. The die paddle 35 is connected to the bottom surface 13 of substrate 10 by bars 32 and 34. The bars 32 and 34 may be formed at an angle relative to the bottom surface 13. Alternatively, the bars 32 and 34 may also be found perpendicular to the surface 13. The bars 32 and 34 may be connected to the bottom surface 13 and die paddle 35 by spot weld, tape, or glue. The bars 32 and 34 may also be formed from substrate 10 by etching, milling, or stamping. A cavity 40 is thus formed in die mounting area 15 by die paddle 35, bars 32 and 34 and opening 25 of frame 20. Preferably, the semiconductor die 2 is mounted inside the cavity 40 such that a surface 4 of semiconductor die 2 is planar with or slightly below top surface 11 of substrate 10. Active surface 4 may also extend a distance above the surface 11 depending on the manufacturing process.

One advantage to the configuration shown in FIG. 4 is that the die paddle 35 protects the bottom surface 3 of the semiconductor die 2 during processing. Additionally, frame 20 adds structural support to the package 1 during the manufacturing process.

Figure 5:
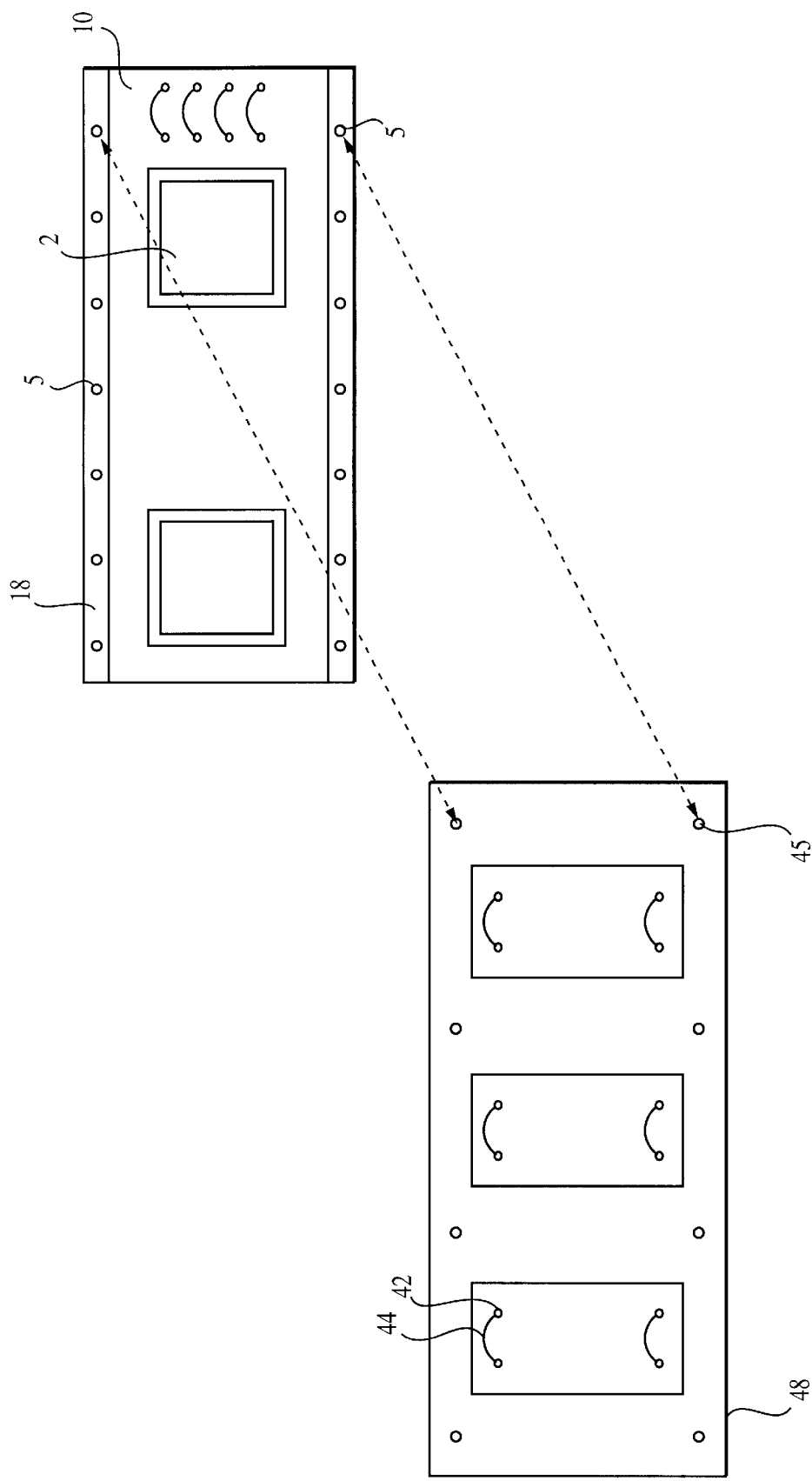
FIG. 5 illustrates the tape of circuitry used to form circuitry on the semiconductor die of FIG. 2.

FIG. 5 shows a plurality of bond pads 42 and circuit traces 44 may be formed onto semiconductor die 2 as follows. A tape 48 with circuitry (i.e. bond pads 42 and circuit traces 44) may be attached onto each of the semiconductor dice 2 by aligning indexing holes 45 of tape 48 with indexing holes 5 (FIG. 1) of substrate 10. Tape 48 may be strip tape or a tape in a reel-to-reel format. An adhesive layer (not shown) may be formed onto the active surface 4 of the die to secure the tape 48 to the active surface 4 of semiconductor die 2. Next, the tape 48 is exposed to suitable pressure to form a bond between the active surface 4 and the bottom surface of the tape.

Tape 48 is substantially flat when it is applied to the substrate 10. This is because the semiconductor die is positioned in cavity 40 such that active surface 4 is substantially planar with top surface 10. This means that fractures and bumps in the tape 48 that occurs due to the protrusion of the semiconductor die 2 from the packages in known systems are minimized. Additionally, the tape 48 may be easily aligned with the semiconductor die 2 using indexing holes 5 and indexing holes 45.

Figure 6:
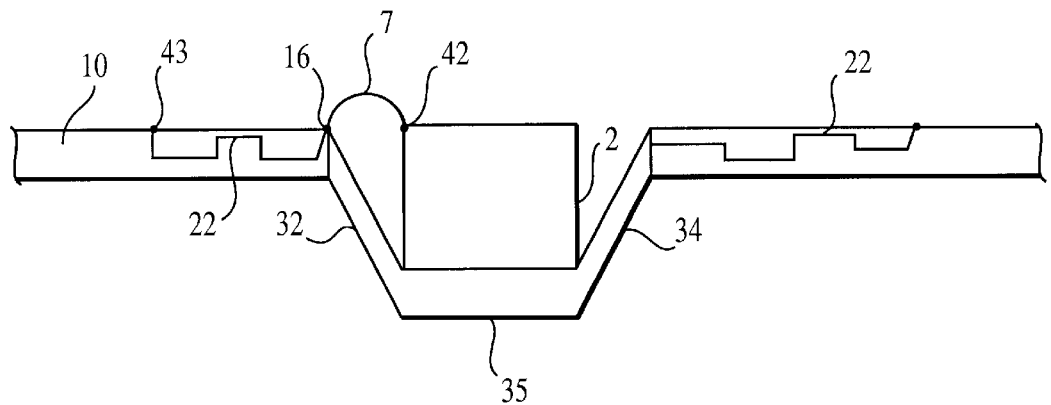
FIG. 6 illustrates an electrical connection formed between the semiconductor die and the substrate.

As shown in FIG. 6, the semiconductor die 2 is then electrically connected to the substrate 10 by electrical connections 7. Electrical connections 7 are thin wires which are formed from an electrically conductive material such as gold or copper. One suitable technique to form the electrical connections 7 is wirebonding. The wirebonding may be performed by a conventional wirebonding apparatus (not shown). Suitable wirebonding techniques include ultrasonic bonding, thermo-compression bonding and thermosonic bonding. An electrical path is thus formed between semiconductor die 2 and conductive terminals 43 through bond pads 42 and 16 and circuit traces 22. The conductive terminals 43 may then be connected to corresponding terminals on a printed circuit board (not shown) by wirebonds, solder balls, or tape-automated bonding.

Alternatively, conductive terminals 43, bond pads 16, and circuit traces 22 may not be formed on surface 11 of substrate 10. In this processing regime, the bond pads 42 of semiconductor die 2 may be electrically connected to corresponding terminals on the printed circuit board via electrical connections 7.

Figure 7:
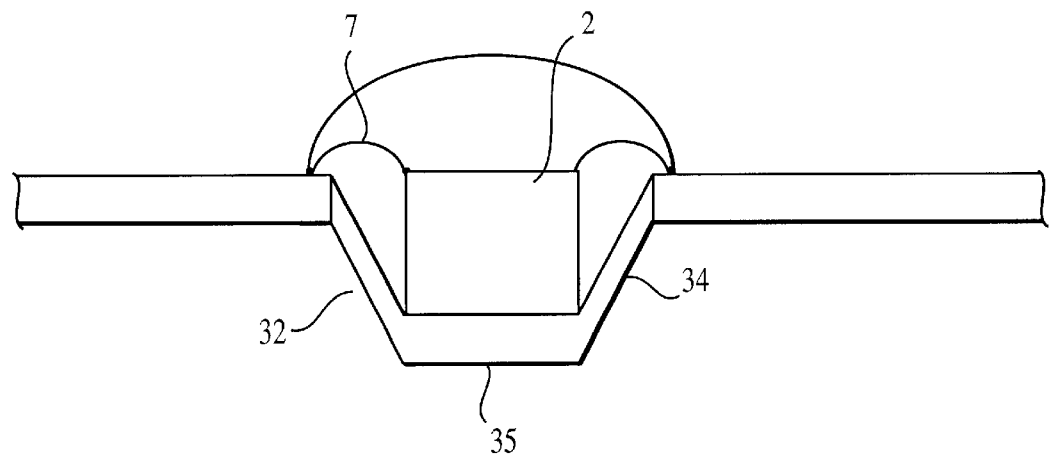
FIG. 7 illustrates an encapsulating layer applied to a portion of the package of FIG. 1.

FIG. 7 shows an encapsulating layer 60 is formed over a portion of the semiconductor die 2. Encapsulating layer 60 may also be deposited over the entire area of the semiconductor die 2 defined by the active surface 3 and bond pads 16. Encapsulating layer 60 is used to protect the semiconductor die 2 from, for example, environmental hazards during processing. Also, encapsulating layer 60 protects and seals electrical connections 7 and bond pads 42 and 16. The encapsulating material may also leave a large portion of the active surface 4 exposed.

The encapsulation layer 60 may be formed from a glob top of material such as epoxy, silicon, or polyimide material. Encapsulation layer 60 is applied to the package 1 by directly forming the layer 60 over the area to be encapsulated such as bond pads 42 and 16. Alternatively, the encapsulating layer may be formed by depositing a material with a high viscosity around the perimeter to be encapsulated, and then filling the center of the layer with a material having a lower viscosity level. After application, the encapsulation material is then cured at a temperature between 150° C. and 200° C.

Each of the semiconductor die 2 formed on substrate 10 may be removed from substrate 10 by a singulating process such as slicing or shearing to form individual circuits.

The package protects the bottom of the die 2. Further, tape 48 can be applied to be coplanar with the top surface 11 because the die 2 is recessed by die paddle 35. This means that the breakage or fracture of the die 2 or tape 48 is minimized during the packaging process. Additionally, the configuration of die paddle 35 allows a BGA having a grid larger than a surface of die 2 to be employed.

The present invention has been described in terms of number of embodiments. The invention, however, is not limited to the embodiments depicted and described. For example, package 1 may be formed for use with flip-chip or lead-on-chip packaging.

What is claimed is:

1. A semiconductor package, comprising:
 a substrate having a first surface and a second surface, a plurality of first bond pads formed on the first surface, a plurality of conductive terminals formed on the first surface, and a plurality of circuit traces formed on the first surface to form an electrical path between selected ones of the first bond pads and selected ones of the conductive terminals;
 a frame formed in the first surface to define an opening in the substrate;
 a plurality of bars extending below the opening from the second surface of the substrate; and
 a die paddle extending between the plurality of bars to form a cavity for receiving a semiconductor die, the semiconductor die having a surface that is substantially coplanar with the first surface of the substrate.

2. The semiconductor package of claim 1, wherein said substrate is formed from ceramic, plastic, or metal alloy.

3. The semiconductor package of claim 1, wherein the package further comprises first and second rails formed integral with or mounted on the first surface of the substrate.

4. The semiconductor package of claim 1, wherein the die further comprises a plurality of second bond pads and the semiconductor package further comprises a plurality of electrical connections formed between selected ones of the first and second bond pads.

5. The semiconductor package of claim 4, wherein the electrical connections are formed by wirebonding.

6. The semiconductor package of claim 1, wherein the conductive terminals are in electrical communication with a plurality of corresponding terminals on a printed circuit board.

7. The semiconductor package of claim 1, wherein the circuit traces are formed from aluminum, gold or copper.

8. The semiconductor package of claim 4, wherein an encapsulating layer is formed on the package to encapsulate the electrical connections.

9. The semiconductor package of claim 1, wherein the conductive terminals are formed from gold or copper.

10. The semiconductor package of claim 1, wherein the first bond pads are formed from gold or copper.

11. The semiconductor package of claim 1, further comprising at least one semiconductor die which includes circuitry formed on an active surface of the die.

12. The semiconductor package of claim 11, further comprising a tape of material on which is formed the circuitry and which includes a plurality of first indexing holes, wherein the substrate further comprises a plurality of second indexing holes such that corresponding ones of the first and second indexing holes are aligned when the circuitry is formed on the active surface of the at least one semiconductor die.

13. The semiconductor package of claim 12, wherein the tape of material is formed from a metal tape.

14. The semiconductor package of claim 1, wherein the die paddle comprises a surface operable to dissipate heat.

15. The semiconductor package of claim 1, further comprising a tape of material containing circuitry positioned on the first surface of the substrate.

16. The semiconductor package of claim 15, wherein the tape of material is substantially coplanar with the first surface of the substrate.

17. An electronic circuit, comprising:
 a substrate having a first surface and a second surface, a plurality of first bond pads formed on the first surface, a plurality of conductive terminals formed on the first surface, and a plurality of circuit traces formed on the first surface to form an electrical path between selected ones of the first bond pads and selected ones of the conductive terminals;

a frame formed in the first surface to define an opening in the substrate;

a plurality of bars extending below the opening from the second surface of the substrate;

a die paddle extending between the plurality of bars to form a cavity for receiving a semiconductor die having a surface that is substantially coplanar with the first surface of the substrate;

a printed circuit board positioned relative to the substrate; and a plurality of electrical connections formed between the semiconductor die and the printed circuit board.

18. A semiconductor package, comprising:

a substrate having a first surface and a second surface, a plurality of first bond pads formed on the first surface, a plurality of conductive terminals formed on the first surface, and a plurality of circuit traces formed on the first surface to form an electrical path between selected ones of the first bond pads and selected ones of the conductive terminals;

a plurality of die mounting areas formed in the substrate for receiving a plurality of semiconductor dice, each of the die mounting areas, including:

a frame formed in the first surface of the substrate to define an opening in the substrate;

a plurality of bars extending below the opening from the second surface of the substrate; and a die paddle extending between the plurality of bars to form a cavity for receiving the die having a surface that is substantially coplanar with the first surface of the substrate.

19. A semiconductor package, comprising:

a substrate having a first surface and a second surface, a plurality of first bond pads formed on the first surface, a plurality of conductive terminals formed on the first surface, and a plurality of circuit traces formed on the first surface to form an electrical path between selected ones of the first bond pads and selected ones of the conductive terminals;

a die mounting area defining an opening in the first surface and a cavity below the second surface; and a semiconductor die positioned in the die mounting area having a surface that is planar with the first surface of the substrate.

* * * * *